United States Patent
Tseng

(10) Patent No.: US 6,316,815 B1
(45) Date of Patent: Nov. 13, 2001

(54) STRUCTURE FOR ISOLATING INTEGRATED CIRCUITS IN SEMICONDUCTOR SUBSTRATE AND METHOD FOR MAKING IT

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/277,202

(22) Filed: Mar. 26, 1999

(51) Int. Cl.[7] .................................................. H01L 29/00
(52) U.S. Cl. ......................... 257/510; 257/499; 257/510; 438/296; 438/353; 438/354; 438/355
(58) Field of Search .................................... 257/510, 499; 438/353–55, 296

(56) References Cited

U.S. PATENT DOCUMENTS

| | | | |
|---|---|---|---|
| 4,740,480 | * | 4/1988 | Ooka ........................................ 437/61 |
| 4,952,524 | * | 8/1990 | Lee et al. ................................. 437/67 |
| 5,229,310 | * | 7/1993 | Sivan ....................................... 437/41 |
| 5,719,085 | * | 2/1998 | Moon et al. ........................... 438/424 |
| 5,733,383 | | 3/1998 | Fazan et al. . |
| 5,747,866 | * | 5/1998 | Ho et al. ............................... 257/506 |
| 5,801,082 | * | 9/1998 | Tseng ..................................... 438/424 |
| 5,801,083 | * | 9/1998 | Yu et al. ................................ 438/424 |
| 5,843,821 | * | 12/1998 | Tseng ..................................... 438/253 |
| 5,923,991 | * | 7/1999 | Bronner et al. ....................... 438/424 |
| 5,945,724 | * | 8/1999 | Parekh et al. ......................... 257/510 |
| 6,033,991 | * | 3/2000 | Ramkumar et al. .................. 438/713 |
| 6,097,076 | * | 8/2000 | Gonzalez et al. ..................... 257/513 |
| 6,175,147 | * | 1/2001 | Akram .................................. 257/647 |
| 6,239,476 | * | 5/2001 | Gardner et al. ....................... 257/513 |

OTHER PUBLICATIONS

Beddingfeild et al. Evaluation of eutectic solder bump interconnect technology IEEE/CPMT Int'l electronics manufacturing technology Symposium 1999 Pg. 131–134.*

* cited by examiner

*Primary Examiner*—Matthew Smith
*Assistant Examiner*—G. Lee
(74) *Attorney, Agent, or Firm*—Intellectual Property Solutions, P.L.L.C.

(57) ABSTRACT

A trench isolation structure characterized by a dielectric stud filling and spanning a trench in a semiconductor substrate is suggested for isolating the integrated circuits fabricated in the semiconductor substrate. The dielectric stud is formed by depositing isolating material in a space defined by the trench and a dielectric layer overlying the semiconductor substrate and being partially removed over an area which spans the trench and extends over the lengthwise edges of the trench.

15 Claims, 16 Drawing Sheets

STRUCTURE FOR ISOLATING INTEGRATED CIRCUITS IN SEMICONDUCTOR SUBSTRATE AND METHOD FOR MAKING IT

FIELD OF THE INVENTION

The present invention relates to a trench isolation structure for isolating integrated circuits, and particularly to a method for forming a trench isolation structure with a dielectric stud filling and spanning a trench in a semiconductor substrate.

BACKGROUND OF THE INVENTION

To keep pace with the increasing density of active devices in ICs (integrated circuits), development of new isolation schemes plays a critically important role in fabricating relatively modernized ICs. A promising alternative among the new isolation schemes is a trench isolation structure and the process for making it.

However, a conventional or prior-art trench isolation structure in ICs usually suffers problems such as current leakage at the corners of a trench, resulting in significant device current leakage in ICs, especially when there's any recess in the trench isolation structure. Consequently various raised trench isolation structures have been suggested as keys to the problem, among which one is the art disclosed in U.S. Pat. No. 5,733,383 and characterized by having a self-aligned cap or dome that is above the upper surface of the semiconductor substrate of an IC device and is formed through several processing steps to first construct a raised trench isolation structure 4 as shown in FIG. 1, and then to deposit insulating material 5 as shown in FIG. 2 conforming to the profile of the raised trench isolation structure 4 shown in FIG. 2. The insulating material 5 according to the prior art is thereafter processed by a step of dry etching to form spacers 6 as shown in FIG. 3, which are then preferably processed by a step of wet pad oxide etching to form a structure having a cap or dome as shown in FIG. 4.

It can be seen that the art suggested by U.S. Pat. No. 5,733,383 requires insulating material 5 to be deposited conforming to the profile of the structure and then etched in a critically sophisticated way in order to form the trench isolation structure shown in FIG. 4. The process for forming such a structure may rely too much on experience or even good luck, leaving a need of developing an alternative scheme for isolating ICs on the basis of trench structure, leading to the development of the present invention.

SUMMARY OF THE PRESENT INVENTION

Objects:

It is a primary object of the invention to provide a method for conveniently and systematically forming a trench isolation structure for isolating ICs fabricated in a semiconductor substrate. It is another object of the invention to provide ICs with a trench isolation structure formed on the basis of insulating dielectric filling and spanning a trench in the semiconductor substrate on which the ICs are fabricated.

It is a further object of the invention to provide a trench isolation structure and method for systematically forming the structure which can significantly reduce the leakage current at trench corners of the trench isolation structure in a semiconductor substrate.

Introduction to The Invention:

The present invention is featured by a dielectric stud filling and spanning a trench in a semiconductor substrate in order to provide requisite isolation for the ICs fabricated in the semiconductor substrate, and to significantly reduce current leakage at corners of the isolation trench. The dielectric stud is made of insulating material or any material capable of electrically isolating integrated circuits.

One aspect of the method provided by the invention for forming such a trench isolation structure in a semiconductor substrate is characterized by the steps of:

(a). forming a first layer overlying the semiconductor substrate, with the first layer functioning as a buffer layer (stress-release layer) which may be a pad oxide layer comprising silicon oxide typically formed by thermal oxidation;

(b).forming a second layer overlying the first layer (buffer layer), with the second layer functioning as an oxidation barrier layer which may be made of silicon nitride;

(c).patterning the second layer and the first layer to form an exposed portion of the semiconductor substrate, while retaining portions of the first and second layers over device areas, i.e., conventional techniques such as one using photolithogrephic skill, photoresist layering, and anisotropic plasma etching are used to etch at least an opening in the first layer and second layer over the areas on the semiconductor substrate where the trench is to be formed, and with used photoresist removed, for example, by plasma etching the patterned second layer (patterned silicon nitride layer) is used to partially etch into the semiconductor substrate from the exposed portion thereof to form a trench that is to surround and electrically isolate device areas of the ICs;

(d).thermally oxidizing the exposed surface of the trench to form a liner layer covering the exposed surface of the trench;

(e).coating a photoresist layer filling the trench and overlying the patterned second layer;

(f).removing a portion of the photoresist layer to expose an upper surface of a trench adjacent second layer portion, the trench adjacent second layer portion being the portion of the patterned second layer adjacent to the trench, the upper surface of the trench adjacent second layer portion being the surface opposite to the surface between the semiconductor substrate and the trench adjacent second layer portion, i.e., the upper surface of the portion of the patterned second layer which is beside the lengthwise edges of the trench is exposed, the edges of the trench being the intersections between the sidewalls (the portions of the trench's surface which are perpendicular to the upper surface of the semiconductor substrate) of the trench and the second layer;

(g).etching, by plasma for example, the trench adjacent second layer portion from its exposed upper surface to leave a remaining second layer portion;

(h).removing the photoresist layer remained;

(i).depositing a type of dielectric such as insulating material to fill the trench and to form a dielectric stud defined by the trench, the patterned first layer, and the remaining second layer portion, i.e., depositing the dielectric to fill the space surrounded by the trench, the patterned first layer, and the remaining second layer portion;

(j).removing the remaining second layer portion to leave an exposed portion of the patterned first layer;

(k).removing the exposed portion of the patterned first layer; a dielectric stud filling the trench and spanning the trench to extend laterally beyond the trench (i.e., to extend over the lengthwise edges of the trench) is thus formed, thereby a trench isolation structure in the shape of a stud is achieved for isolating ICs while significantly reducing current leakage at corners of the trench.

In step (i) of the method suggested by the invention and described above, the dielectric may be deposited so as to extend onto the upper surface of the remaining second layer portion, and then processed by CMP (chemical/mechanical polishing) to be aligned with the upper surface of the remaining second layer portion.

In step (k) of the method suggested by the invention and described above, the dielectric stud spanning the trench to extend laterally beyond the trench may be partially removed without affecting the formation of a usable trench isolation structure as long as it still spans the trench to extend over the lengthwise edges of the trench.

The structure provided by the invention for isolating integrated circuits fabricated in a semiconductor substrate is characterized by comprising:

a trench formed in the semiconductor substrate by, for example, patterning a dielectric layer which overlies a substrate upper surface of the semiconductor substrate to form an exposed portion of the substrate upper surface, and by etching the exposed portion of the substrate upper surface, the dielectric layer being preferably a layer composed of a buffer layer and an oxidation barrier layer, or the dielectric layer being preferably a layer capable of functioning as both the buffer layer and the oxidation barrier layer;

and a dielectric stud formed by depositing a type of isolating (or insulating) material in a space defined by the trench and a remaining dielectric layer portion of the patterned dielectric layer, the remaining dielectric layer portion being the portion left after etching the patterned dielectric layer beside the trench, i.e., the dielectric stud is formed by depositing the isolating material in the space surrounded by the trench (specifically speaking, the space is surrounded by the inner surface or exposed surface of the trench) and the remaining dielectric layer portion of the patterned dielectric layer.

In the structure provided by the invention and described above, the trench has an opening and lengthwise edges thereof defined by the patterned dielectric layer when forming the trench, and the remaining dielectric layer portion is formed by etching the patterned dielectric layer beside the lengthwise edges of the trench; i.e., the remaining dielectric layer portion is the portion of the patterned dielectric layer left by etching the patterned dielectric layer beside the lengthwise edges of the trench.

The structure provided by the invention and described above may further comprise a liner layer between the inner surface of the trench and the dielectric stud, and may also further comprise a first layer (buffer layer) lying between the dielectric stud and an interface portion of the substrate upper surface which is under the dielectric stub and beside the trench, the liner layer is formed by thermally oxidizing the inner surface of the trench before the dielectric stud is formed, the first layer (buffer layer) may be formed overlying the substrate upper surface before the dielectric layer is formed.

Another aspect of the method provided by the invention for forming a trench isolation structure in a semiconductor substrate for isolating ICs in the semiconductor substrate is characterized by comprising the steps of:

(a). forming a first layer (buffer layer) overlying the semiconductor substrate;

(b). forming a second layer (oxidation barrier layer) overlying the first layer (buffer layer);

(c). patterning the second layer, the first layer, and the semiconductor substrate to form at least a trench having an exposed surface;

(d). forming a liner layer to cover the exposed surface of the trench;

(e). removing the patterned second layer partially to leave a remaining second layer portion for forming an empty space which spans the trench to extend laterally beyond the trench, and is surrounded by the remaining second layer portion;

(f). depositing a type of dielectric filling the trench and the empty space to form a dielectric stud;

(g). removing the remaining second layer portion to leave an exposed portion of the patterned first layer;

(h). removing the exposed portion of the patterned first layer.

In the method provided by the invention and described above as another aspect of the invention, step (e) may be implemented by a typical process in the field of IC industry or by a combination of various standard steps in this field.

In the method provided by the invention and described above as another aspect of the invention, a trench-nearby portion of the patterned first layer is left after removing the patterned second layer partially in step (e) and the empty space extends beyond the trench and along the trenchnearby portion of the patterned first layer in step (e).

In the method provided by the invention and described above as another aspect, a spanning portion of the dielectric stud spans the trench and may be partially removed in step (h) without affecting the formation of the trench isolation structure as long as the spanning portion of the dielectric stud still spans the trench to extend over the lengthwise edges of the trench.

Distinction Between The Invention and Prior Art:

Although no prior art has ever been known as substantially similar to the invention, the distinction between the invention and U.S. Pat. No. 5,733,383 is to be described as follows.

Characterized by having a self-aligned cap or dome that is above the upper surface of the semiconductor substrate of an IC device and is formed through several processing steps to first construct a raised trench isolation structure 4 as shown in FIG. 1, and then to deposit insulating material 5 as shown in FIG. 2 conforming to the profile of the raised trench isolation structure shown in FIG. 2, with insulating material 5 thereafter etched by different steps to form a structure having a cap or dome as shown in FIG. 4, the art disclosed in U.S. Pat. No. 5,733,383 requires relatively experience-dependent steps of depositing insulating material 5 conforming to the profile of the structure 4 shown in FIG. 2, and etching the deposited insulating material in a critically sophisticated way in order to form the trench isolation structure shown in FIG. 3. The process for forming such a structure suggested by the prior art may rely too much on experience or even good luck, leading to difficulty of fabricating it in a systematic way or by reliably controllable processes.

The trench isolation structure according to present invention, however, can be formed easily by a combination of systematic, typical, and reliably controllable processing steps implemented in a novel way as can be understood according to the descriptions hereinafter.

DETAILED DESCRIPTION OF THE PREFERRED EMBODIMENTS

Figure 15:
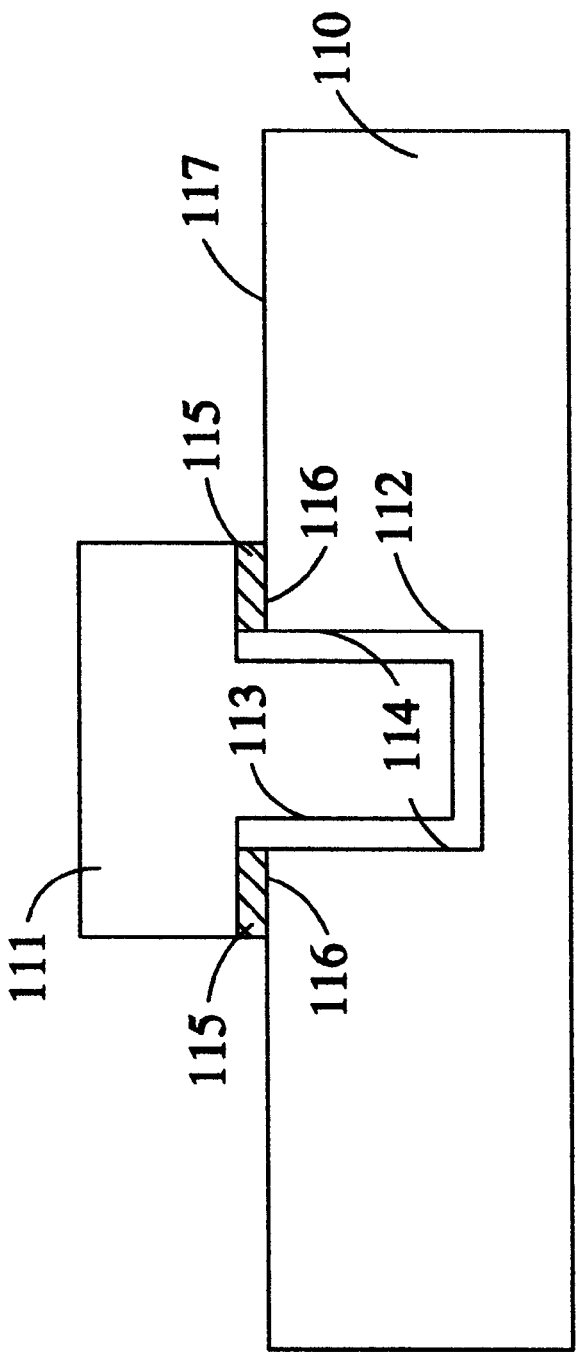
FIG. 15 shows a cross-sectional view of the semiconductor substrate having the dielectric stud shown in FIG. 14 partially removed.

The isolation structure provided by the invention for isolating ICs fabricated in a semiconductor substrate may be illustrated by FIG. 15 where a dielectric stud 111 made of electrically insulating material and formed in T-shape fills and spans a trench 112 in the semiconductor substrate 110. The structure may further include a liner layer 113 between the dielectric stud 111 and the inner surface 114 of trench 112, and may also further include a first layer (buffer layer) 115 lying between an interface portion 116 of the upper surface 117 of semiconductor substrate 110. The liner layer 113 may be formed by thermally oxidizing the semiconductor substrate inside trench 112 before dielectric stud 111 is filled in trench 112, and first layer (buffer layer) 115 may be a layer left by removing a portion of a first layer (pad oxide layer) formed overlying upper surface 117 of semiconductor substrate 10 in one of the processing steps before dielectric stud 111 is filled in trench 112, which can be further understood hereinafter.

Figure 5A:
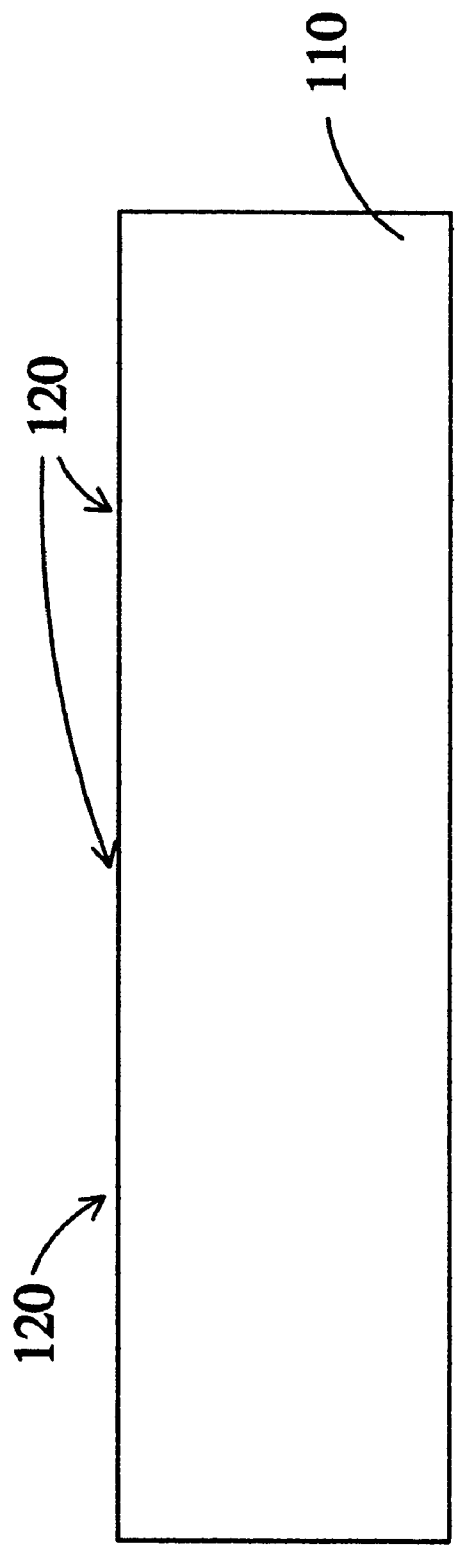
FIG. 5a and 5b respectively show a cross-section view of a semiconductor substrate and a first layer (buffer layer or pad oxide layer) and a second layer (oxidation barrier layer or silicon nitride layer) overlying thereon.
Figure 5B:
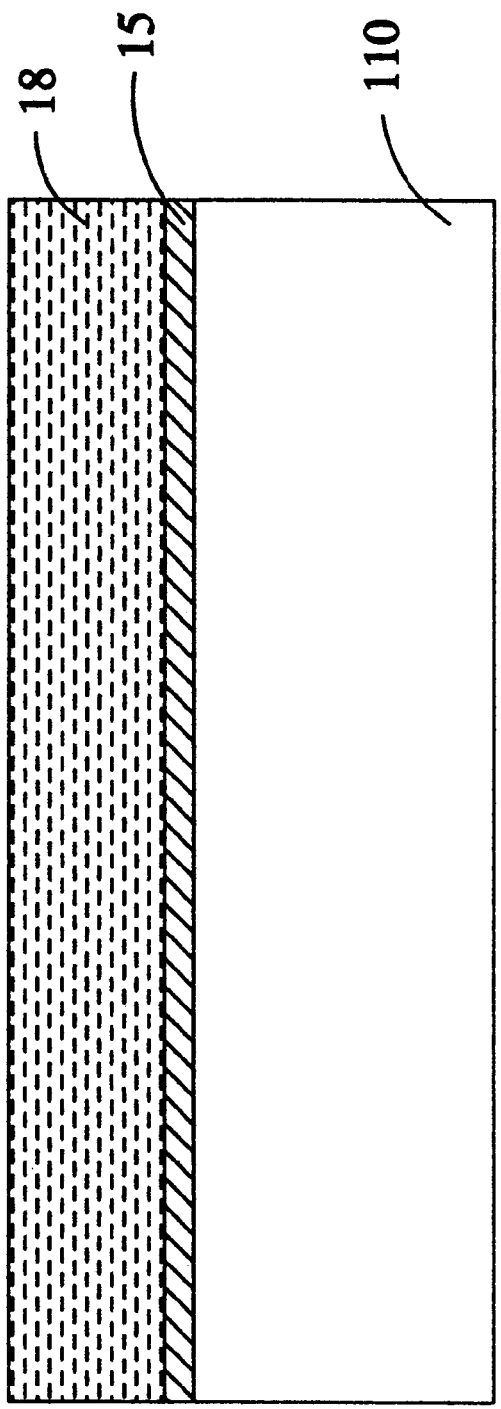
Figure 6:
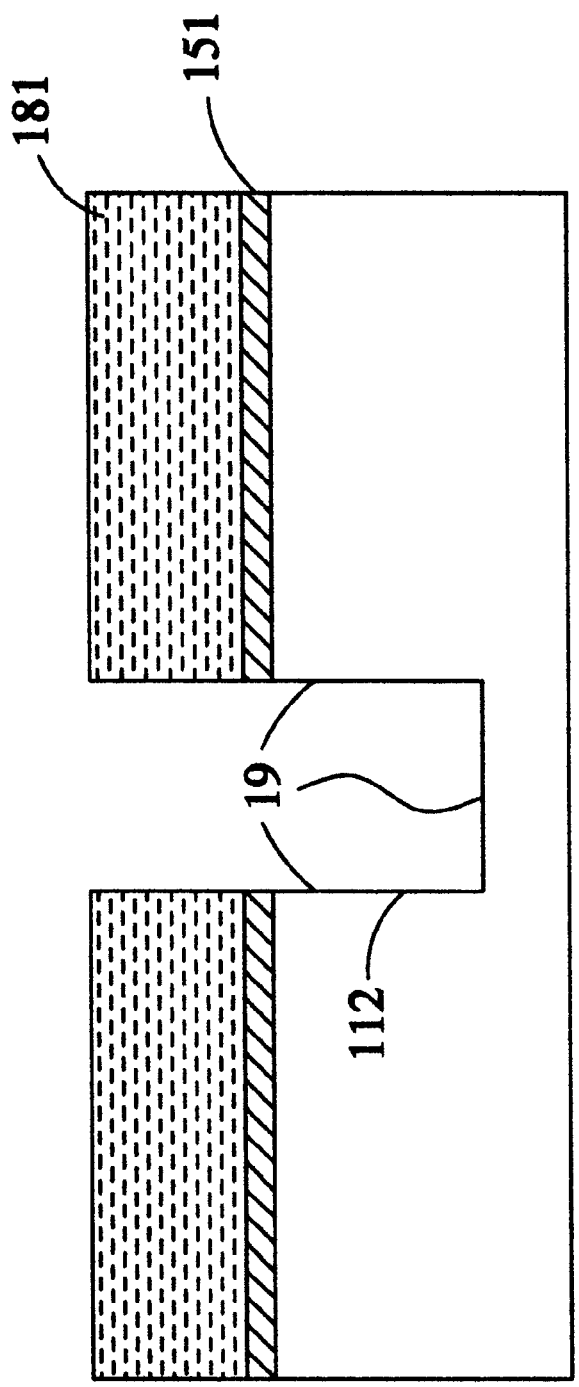
FIG. 6 shows a cross-section view of a trench formed in the semiconductor substrate.

A preferred embodiment of the method provided by the invention for forming the isolation structure shown in FIG. 15 for isolating ICs fabricated on the basis of a semiconductor substrate is described below with reference to the drawings. The preferred embodiment of the method is characterized by comprising the steps of:

(a). forming a first layer (buffer layer) 15 overlying the semiconductor substrate 110 as shown in FIG. 5b; for example, letting the first layer 15 formed on the top of an upper surface 120 of the semiconductor substrate 110 as shown in FIG. 5a;

(b). forming a second layer 18 overlying the first layer (buffer layer) 15 as shown in FIG. 5b;

(c). patterning the second layer 18 and the first layer (buffer layer) 15 to form an exposed portion of the semiconductor substrate 110, and etching the semiconductor substrate 110 from the exposed portion thereof to form at least a trench 112 having an exposed surface 19, as shown in FIG. 6 where the second layer 18 has become a patterned second layer 181 and the first layer (buffer layer) 15 has become a patterned first layer (buffer layer) 151.

Figure 7:
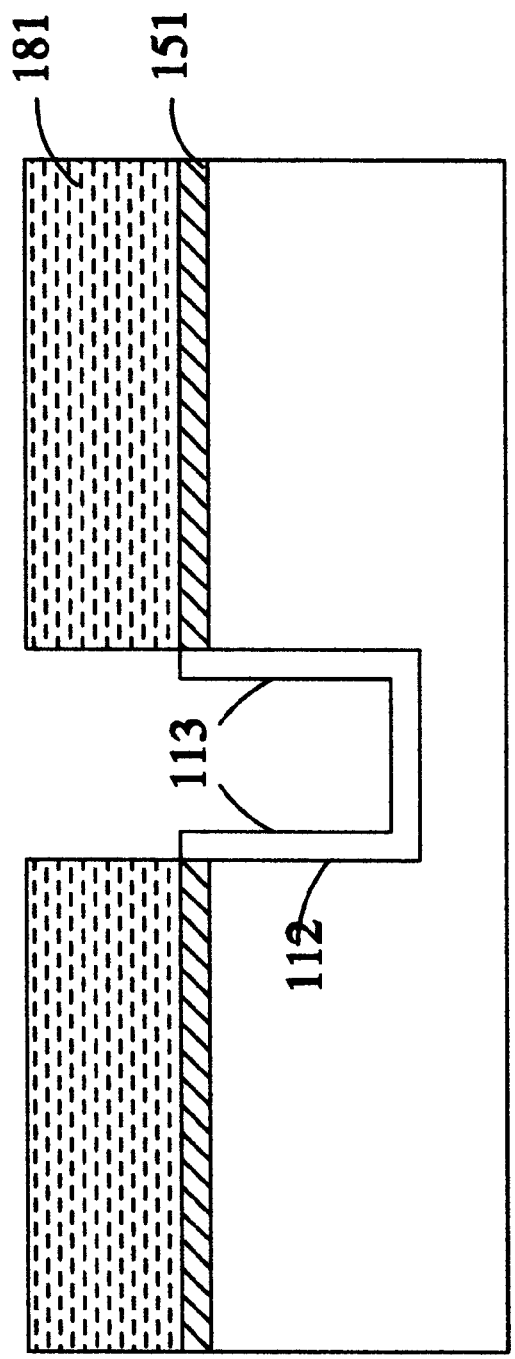
FIG. 7 shows a cross-sectional view of a trench formed in the semiconductor substrate with its inner surface (or exposed surface) covered by a liner layer.
Figure 8:
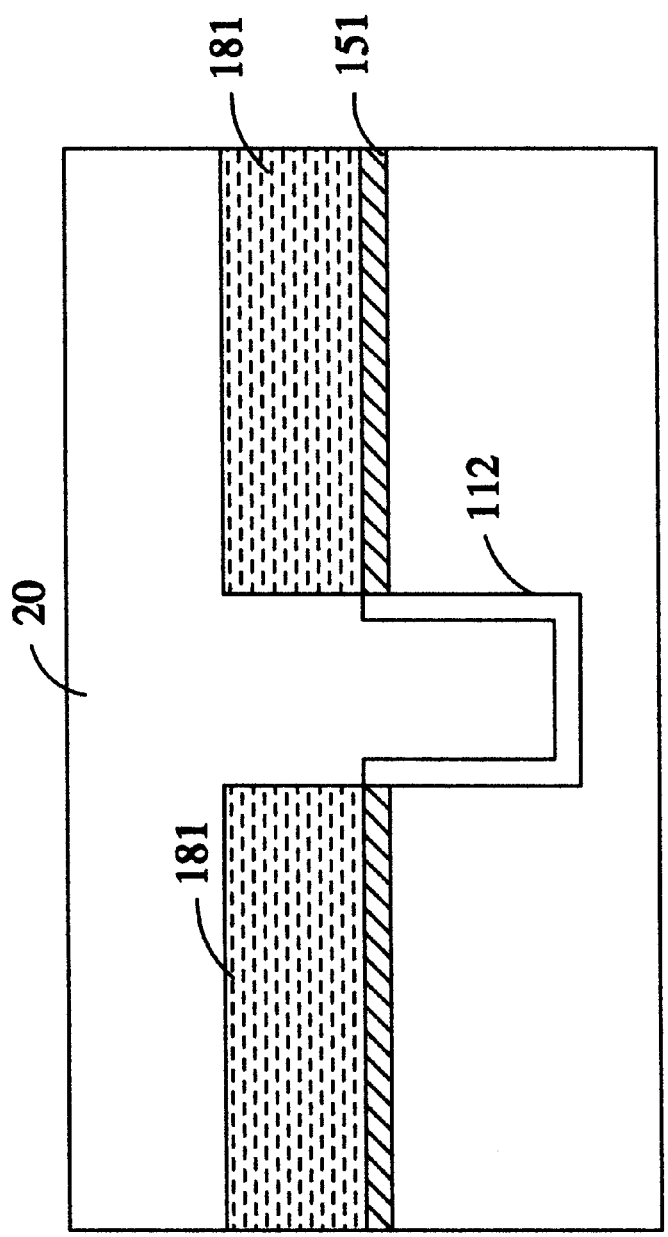
FIG. 8 shows a cross-sectional view of the semiconductor substrate having a trench therein, and a photoresist layer overlying the second layer (silicon nitride layer).
Figure 9:
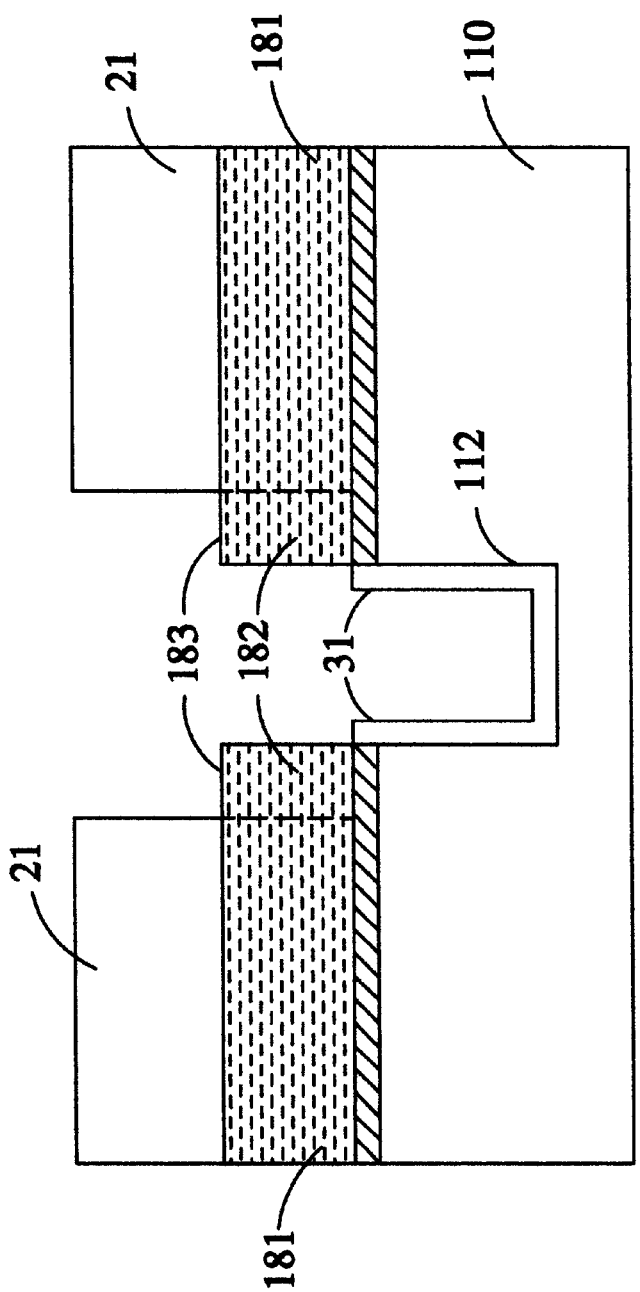
FIG. 9 shows a cross-sectional view of the semiconductor substrate having a trench therein, and a photoresist layer overlying a portion of the second layer (silicon nitride layer).
Figure 10:
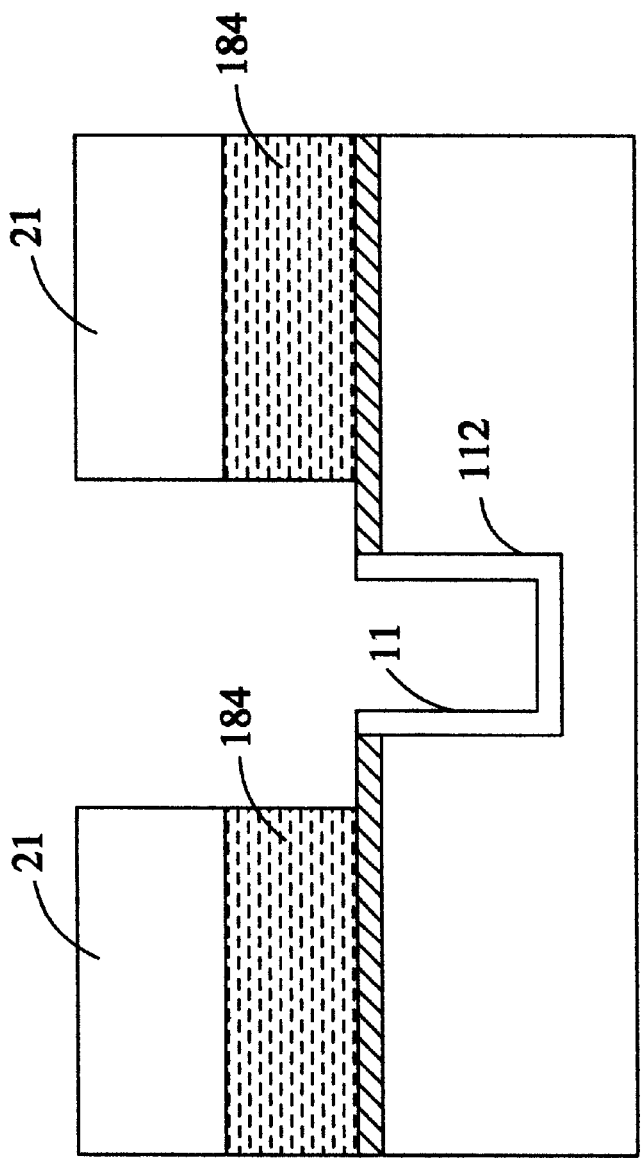
FIG. 10 shows a cross-sectional view of the semiconductor substrate having a trench therein, and a remaining portion of the second layer (silicon nitride layer) left after partially removing the second layer near the trench, while with the photoresist layer still remained on the second layer (silicon nitride layer).
Figure 11:
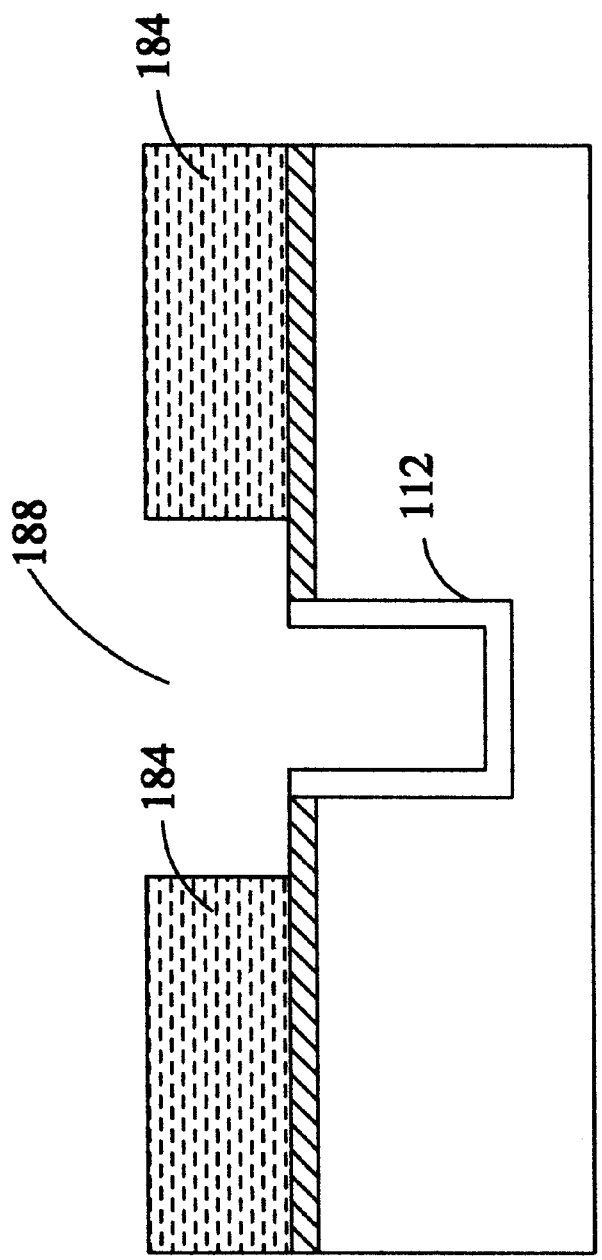
FIG. 11 shows a cross-sectional view of the semiconductor substrate having trench therein, and an empty space spanning the trench and surrounded by the remaining portion of the second layer (silicon nitride layer).
Figure 12:
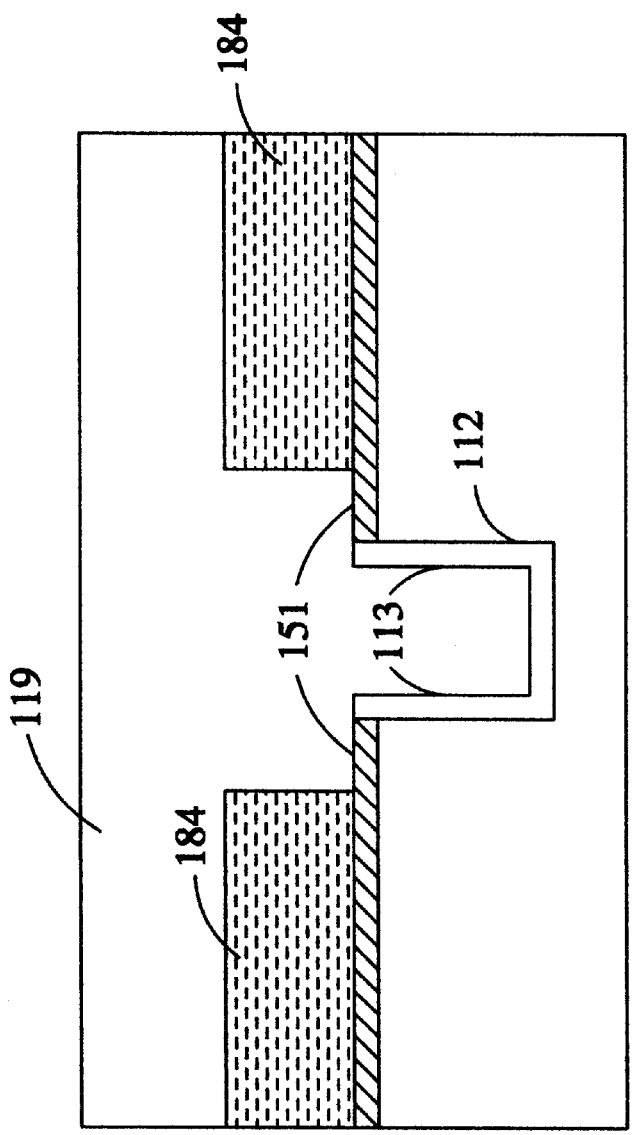
FIG. 12 shows a cross-sectional view of the semiconductor substrate having a trench therein, and one type of dielectric filling the trench and extending onto the upper surface of the remaining portion of the second layer (silicon nitride layer).
Figure 13:
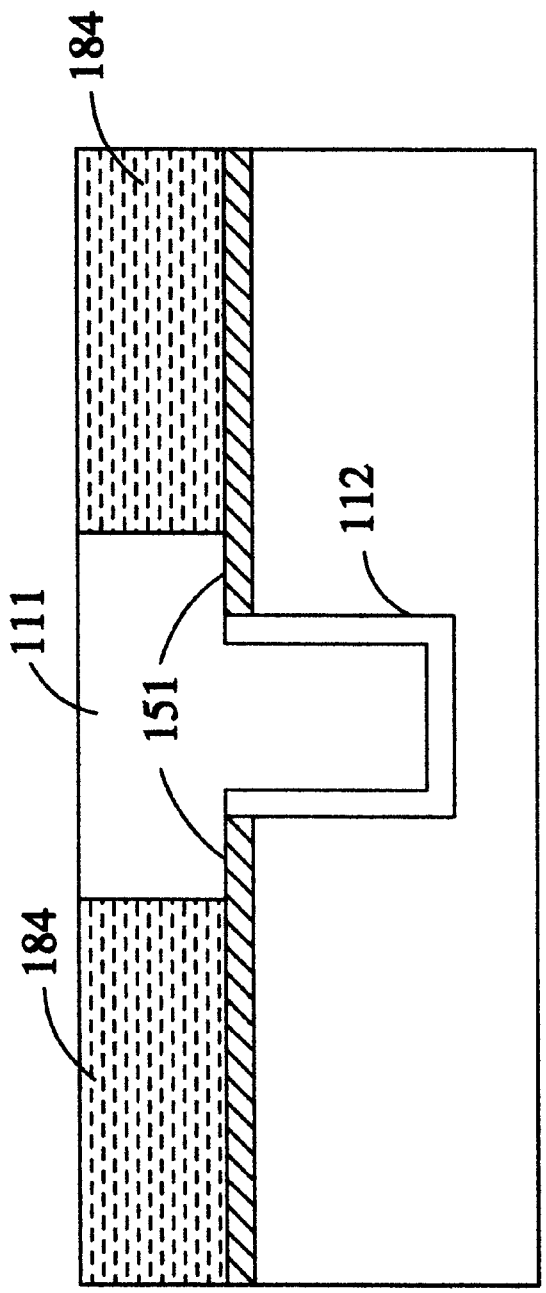
FIG. 13 shows a cross-sectional view of the semiconductor substrate having a trench therein, and one type of dielectric aligned with the upper surface of the remaining portion of the second layer (silicon nitride layer).
Figure 14:
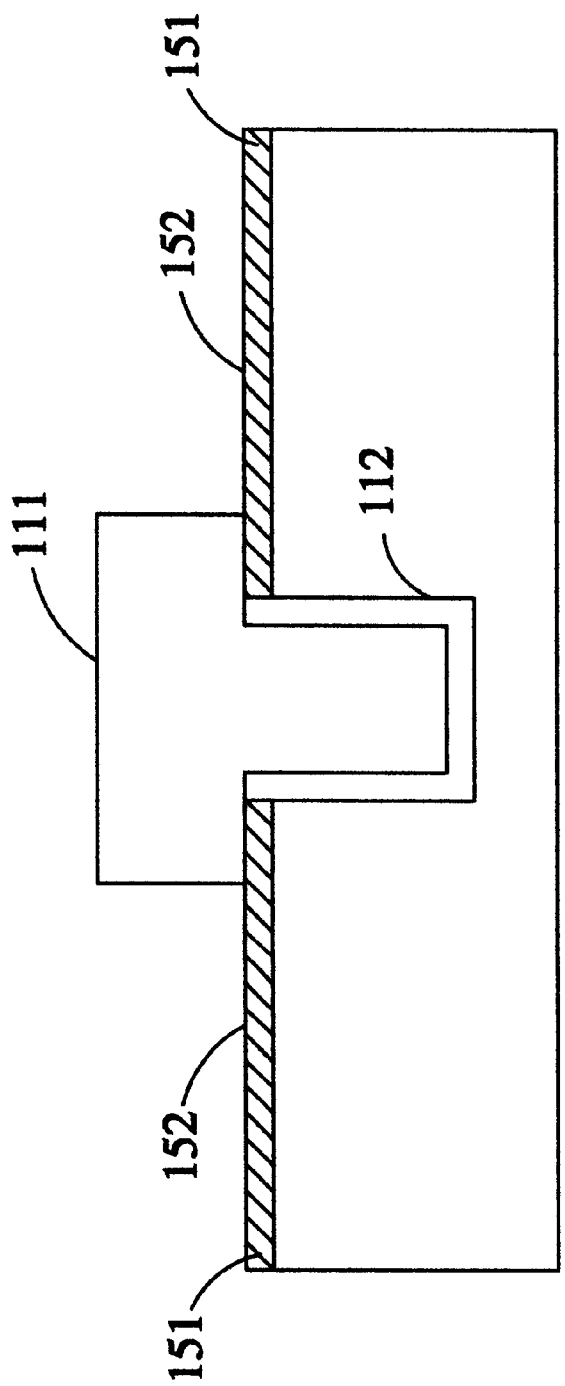
FIG. 14 shows a cross-sectional view of the semiconductor substrate having a dielectric stud filling and spanning the trench therein after removing the remaining portion of the second layer (silicon nitride layer).

(d). forming a liner layer 113 as shown in FIG. 7 to cover the exposed surface 19 of the trench 112 shown in FIG. 6;

(e). coating a photoresist layer 20 filling the trench 112 and overlying the patterned second layer 181, as shown in FIG. 8;

(f). removing a portion of the photoresist layer 20 shown in FIG. 8 to expose an upper surface 183 of a trench adjacent second layer portion 182 which is distinguished from the patterned second layer 181 by dotted lines as shown in FIG. 9, the trench adjacent second layer portion 182 being the portion of the patterned second layer 181 which is adjacent to the trench 112, the upper surface 183 of the trench adjacent second layer portion 182 being the surface opposite to the surface 31 between the semiconductor substrate 110 and the trench adjacent second layer portion 182, as shown in FIG. 9; i.e., the upper surface 183 of the trench adjacent second layer portion 182 (182 is part of the patterned second layer 181 and is beside the lengthwise edges of the trench 112) is exposed, the lengthwise edges of the trench 112, not shown in the drawings, are the intersections between the sidewalls (portions which are parts of trench surface and are perpendicular to the upper surface 120 of semiconductor substrate 110) of the trench 112 and a surface which may be either upper surface 120 of semiconductor substrate 110 or surface 31 (the alternative of upper surface 120 and surface 31 doesn't make a difference for defining the invention), and are perpendicular to the cross-sectional view of FIG. 9, photoresist layer 21 being left after partially removing the photoresist layer 20 shown in FIG. 8;

(g). etching, by plasma for example, the trench adjacent second layer portion 182 from the exposed upper surface 183 thereof to leave a remaining second layer portion 184 shown in FIG. 10;

(h). removing the photoresist layer 21 shown in FIG. 10 to obtain a profile state shown in FIG. 11;

(i). depositing, as shown in FIG. 13, a dielectric (insulating material, for example) filling the trench 112 and forming a dielectric stud 111 defined by the trench 112, the patterned first layer (patterned buffer layer) 151, and the remaining second layer portion 184; i.e., depositing the dielectric to fill the space surrounded by the trench 112, the patterned first layer (patterned buffer layer) 151, and the remaining second layer portion 184;

specifically speaking, the dielectric is deposited to fill the space surrounded by the liner layer 113 covering the inner surface of the trench, the patterned first layer 151, and the remaining second layer portion 184; if the dielectric extends onto the upper surface of remaining second layer portion 184 as shown in FIG. 12, a processing step such as CMP (chemical/mechanical polishing) for removing part of dielectric stud 119 to align the dielectric stud 119 with the upper surface of remaining second layer portion 184 is necessary for forming a dielectric stud 111 shown in FIG. 13, while the processing step of removing part of dielectric stud 119 is not necessary if the dielectric is so deposited that the dielectric stud 119 is aligned with the upper surface of remaining second layer portion 184 as shown in FIG. 13 or is below the upper surface of remaining second layer portion 184;

(j). removing the remaining second layer portion 184 to leave an exposed portion 152 of the patterned first layer (buffer layer) 151 as shown in FIG. 14;

(k). removing the exposed portion 152 of the patterned first layer (buffer layer) 151 to obtain the trench isolation structure shown in FIG. 15 for isolating the ICs fabricated in semiconductor substrate 10 while significantly reducing current leakage at corners of the trench 112.

It must be noted that in step (k) of the method suggested by the invention and described above, the dielectric stud 111 spanning the trench to extend laterally beyond the trench as shown in FIG. 14 may be partially removed without affecting the formation of the trench isolation structure shown in FIG. 15 as long as it still spans the trench 112 to extend over the lengthwise edges of the trench 112.

Figure 1:
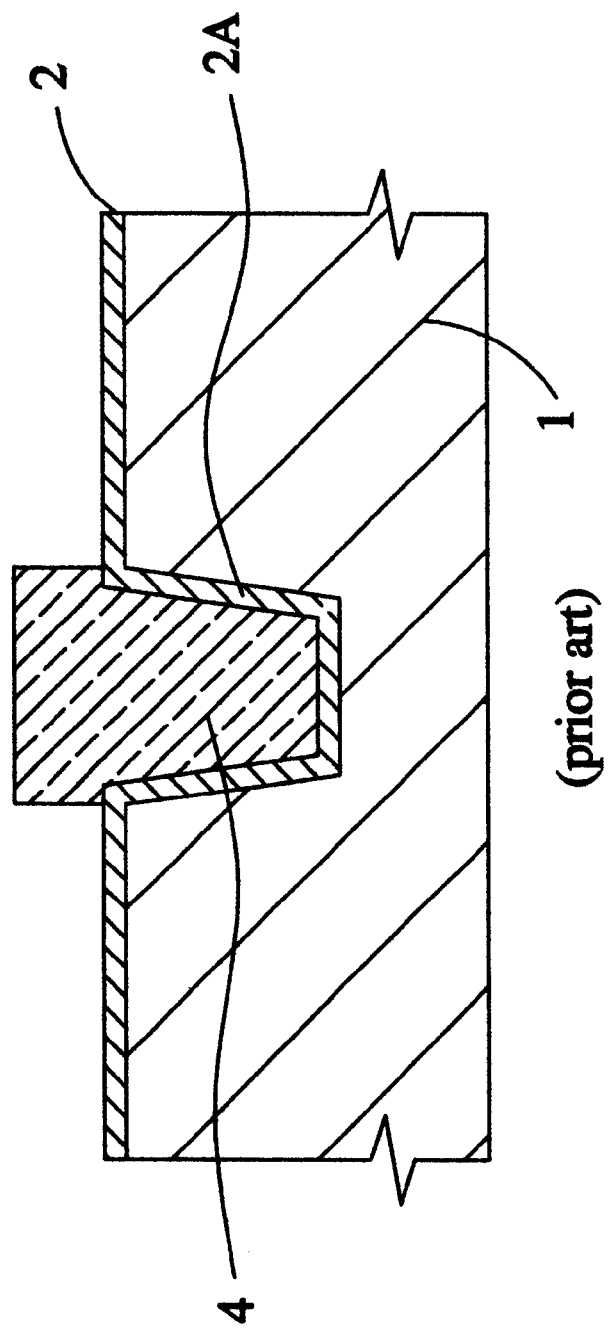
FIG. 1 shows a raised trench isolation structure formed through several steps and to be processed for forming a trench isolation structure with a cap or dome profile as suggested by a prior art.
Figure 2:
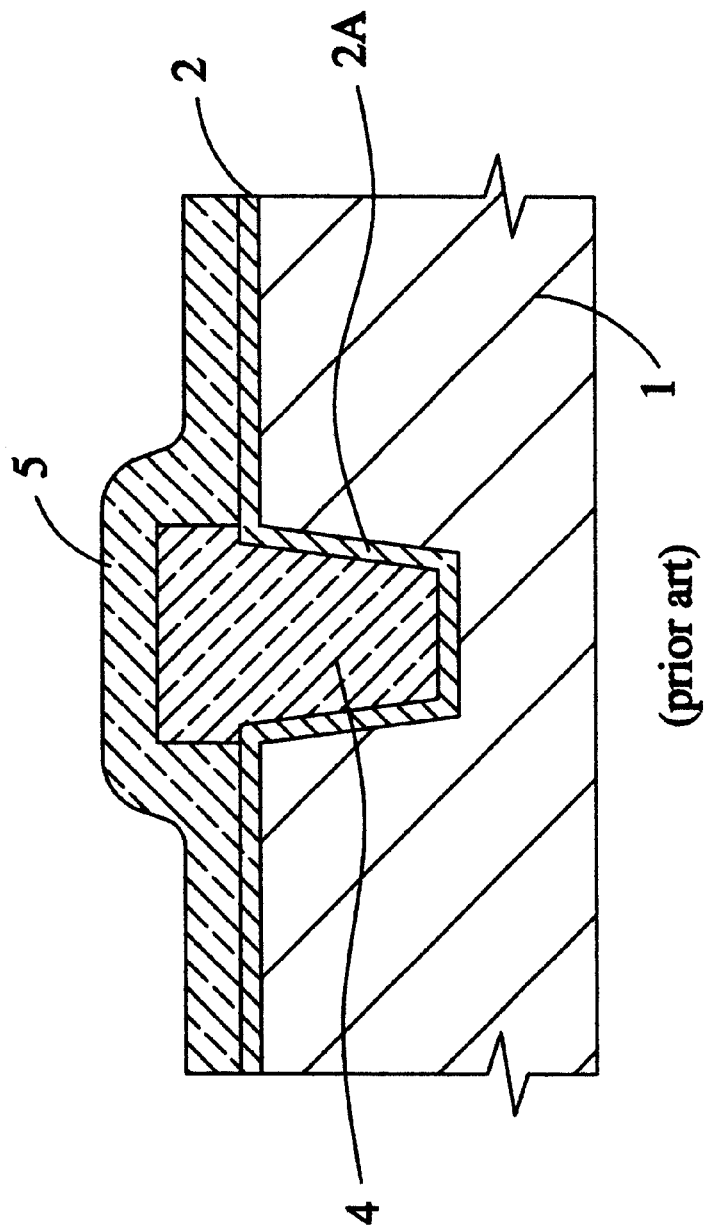
FIG. 2 and FIG. 3 show processing steps for forming the trench isolation structure with a cap or dome profile as suggested by the prior art.
Figure 3:
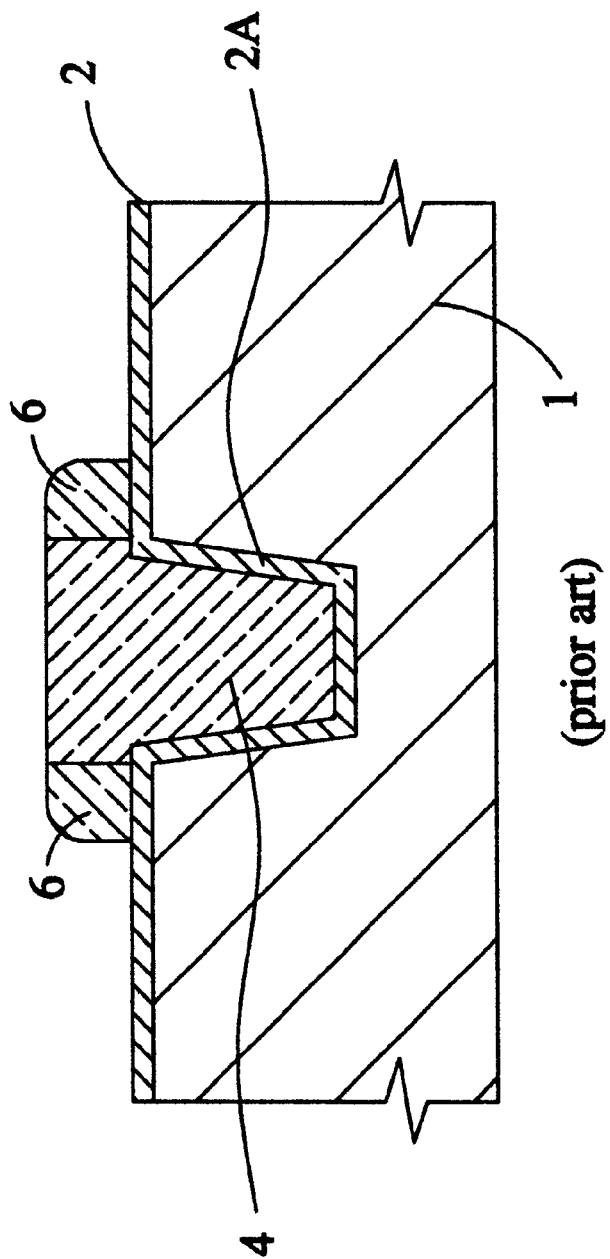
Figure 4:
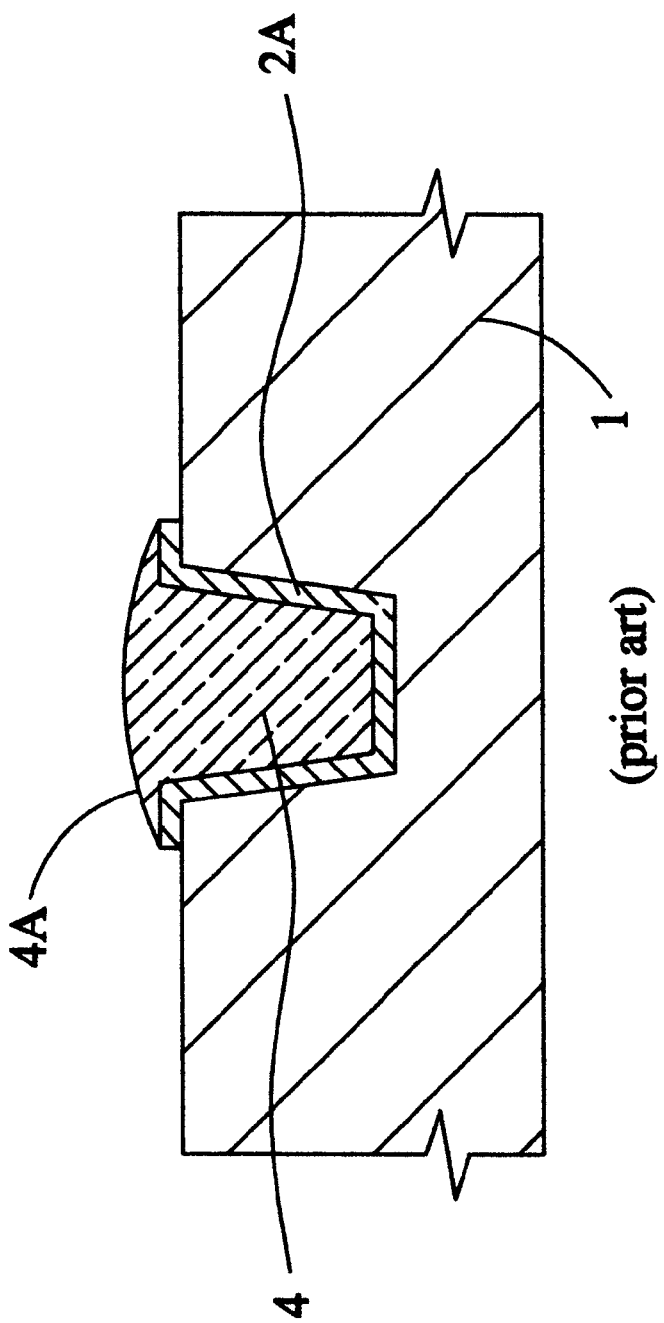
FIG. 4 shows the trench isolation structure with a cap or dome profile as suggested by the prior art.

It shall be understood various approaches besides the above steps (a)~(h) may be used to form trench 112 and the empty space 188 which surrounded by the remaining second layer portion 184 shown in FIG. 11. Any method for forming a trench isolation structure on the basis of such a trench and empty space shall be included in the scope of the present invention. Obviously a method for forming a trench isolation structure on the basis of such a trench 112 accompanied with the empty space 188 shown in FIG. 11, and the dielectric stud formed thereupon and shown in FIG. 14 or 15 are substantially different from the art suggested by U.S. Pat. No. 5,733,383 mainly because of the following facts:

1. The formation of trench 112 accompanied with empty space 188 spanning the trench 112 as shown in FIG. 11 according to the present invention enables the formation of dielectric stud 111 in FIG. 14 by systematic and reliably controllable processing steps, while the art suggested by U.S. Pat. No. 5,733,383 requires relatively experience-dependent processing steps to process the structure shown in FIG. 1 for forming the structure shown in FIG. 4, due to the difficulty of controlling proper thickness of deposited insulating material 5 as shown in FIG. 2 for forming spacers 6 shown in FIG. 3, and the relatively sophisticated processing steps thereafter for forming a domed or cap structure.

2. The trench isolation structure suggested by the prior art shown in FIG. 4 and the processing steps for making it are clearly motivated by the object of forming a trench isolation structure with a cap or dome profile, as can be seen by the fact that no alternative other than the relatively experience-dependent processing steps are considered or suggested by the prior art for forming the trench isolation structure shown in FIG. 4 even though the cap or dome profile requires relatively complex processing steps.

While the invention has been described in terms of what are presently considered to be the most practical and preferred embodiments, it shall be understood that the invention is not limited to the disclosed embodiment. On the contrary, it is intended to cover various modifications and similar arrangements included within the spirit and scope of the following claims which are to be accorded with the broadest interpretation to encompass all modifications and similar structures based thereon.

What is claim is:

1. A method for forming a trench isolation structure in a semiconductor substrate, comprising the steps of
   (a) forming a first layer overlying the semiconductor substrate;
   (b) forming a second layer overlying said first layer;
   (c) patterning said second layer and said first layer to expose a portion of said semiconductor substrate, and etching said semiconductor substrate from the exposed portion thereof to form at least a trench having an exposed surface;
   (d) forming a liner layer to cover the exposed surface of said trench;
   (e) coating a photoresist layer filling said trench and overlying the patterned second layer (oxidation barrier layer);
   (f) removing a portion of said photoresist layer to expose an upper surface of said second layer laterally adjacent said trench, the upper surface of said trench adjacent second layer portion being the surface opposite to the surface between said semiconductor substrate and said trench adjacent second layer portion;
   (g) etching said trench adjacent second layer portion from the exposed upper surface thereof to said first layer to create an empty space and to leave a remaining second layer portion;
   (h) removing said photoresist layer;
   (i) depositing a dielectric to fill said trench and form a dielectric stud defined by said trench, the patterned first layer, and said remaining second layer portion;
   (j) removing said remaining second layer portion to leave an exposed portion of the patterned first layer, and
   (k) removing the exposed portion of the patterned first layer.

2. The method of claim 1 wherein step (c) comprises a step of forming at least an opening in said first layer and said second layer using a photoresist layer and by plasma etching.

3. The method of claim 1 wherein said first layer is a pad oxide layer and said second layer is a silicon nitride layer.

4. The method of claim 1 wherein said liner layer is a layer formed by thermally oxidizing said semiconductor substrate.

5. The method of claim 1 wherein said trench adjacent second layer portions are etched by plasma in step (g).

6. The method of claim 1 wherein said dielectric is an electrical insulator.

7. The method of claim 1 wherein said dielectric stud is formed so as to have a portion thereof above said semiconductor substrate and covering the portions of said semiconductor which are adjacent to said trench.

8. A trench isolator for isolating integrated circuits in a semiconductor substrate, comprising:
   a trench formed in said semiconductor substrate and having inner surface thereof covered by a liner layer and having lengthwise edges thereof intersecting an upper surface of said semiconductor substrate; and a dielectric stud formed by depositing dielectric material in a space defined by said trench and a dielectric layer overlying said upper surface of said semiconductor substrate and being partially removed over an area which spans said trench and extends laterally over the lengthwise edges of said trench.

9. The trench isolator of claim 8 further comprising a buffer layer lying between said dielectric stud and said upper surface of said semiconductor substrate.

10. The trench isolator of claim 8 wherein said liner layer is a layer formed by thermally oxidizing the inner surface of said trench before said dielectric stud is formed.

11. A method for forming a trench isolation structure in a semiconductor substrate, comprising the steps of (a) forming a first layer overlying the semiconductor substrate;

(b) forming a second layer overlying said first layer;

(c) patterning said second layer and said first layer to expose a portion of said semiconductor substrate, and etching said semiconductor substrate from the exposed portion thereof to form at least a trench having an exposed surface;

(d) forming a liner layer to cover the exposed surface of said trench;

(e) removing the patterned second layer partially to leave a remaining second layer portion for forming an empty space which spans said trench to extend laterally beyond said trench, and is surrounded by said remaining second layer portion;

(f) depositing a dielectric material filling said trench and said empty space to form a dielectric stud;

(g) removing said remaining second layer portion to leave an exposed portion of the patterned first layer;

(h) removing said exposed portion of the patterned first layer.

12. The method of claim 11 wherein said exposed portion of the patterned first layer is left after removing the patterned second layer partially in step (e) and wherein said empty space extends beyond said trench along said exposed portion of the patterned first layer in step (e).

13. The method of claim 11 wherein a spanning portion of said dielectric stud is partially removed in step (h), the spanning portion of said dielectric stud is the portion of said dielectric spanning said trench.

14. The method of claim 13 wherein the partially removed spanning portion of said dielectric stud still spans said trench and extends laterally beyond said trench.

15. The method of claim 13 wherein the partially removed spanning portion of said dielectric stud still spans said trench and extends a minimum distance laterally beyond said trench.

\* \* \* \* \*